United States Patent
Handforth et al.

[11] Patent Number: 6,061,241
[45] Date of Patent: May 9, 2000

[54] LINE INTERFACE MODULE

[75] Inventors: Martin Ridgway Handforth, Kanata, Canada; Donald G. Paterson, Raleigh, N.C.; Sudhir Majmudar, Ottawa; Michael H. Daniels, Kanata, both of Canada

[73] Assignee: Nortel Networks Corporation, Montreal, Canada

[21] Appl. No.: 09/209,759

[22] Filed: Dec. 11, 1998

[30] Foreign Application Priority Data

Dec. 19, 1997 [CA] Canada ................................. 2225235

[51] Int. Cl.⁷ ....................................... H05K 7/20
[52] U.S. Cl. ..................... 361/704; 361/707; 361/715; 361/717; 361/718; 361/719; 361/738; 361/761; 361/766; 361/760; 361/777; 174/250; 174/252; 174/260
[58] Field of Search .......................... 361/704, 718–720, 361/721, 738, 766, 784–791; 174/16.3, 250, 252, 260–263

[56] References Cited

U.S. PATENT DOCUMENTS

| | | | |
|---|---|---|---|
| 4,498,120 | 2/1985 | Kaufman | 361/720 |
| 4,879,630 | 11/1989 | Boucard et al. | 361/722 |
| 5,367,436 | 11/1994 | Ikei | 361/766 |
| 5,525,763 | 6/1996 | Van Liere | 174/263 |

Primary Examiner—Leo P. Picard
Assistant Examiner—Boris Chervinsky
Attorney, Agent, or Firm—Foley & Lardner

[57] ABSTRACT

A line circuit module is disclosed which comprises effectively all of the required circuitry for a line card apart from mechanical components such as relays and edge card connectors. The module includes a small ceramic substrate 2.0 inches by 0.825 inches on to which surface mount components which include a heat sensitive integrated circuit and a field effect transistor are mounted to one side and thick film components which include two battery feed resistors are printed on an opposite side. Various innovative techniques are disclosed which significantly reduce compromising component thermal interactions. Heat concerns from using a small thermally conductive substrate have been managed through advantageous use of printed battery feed resistor layouts which provide for larger portions of heat to be dissipated in resistor portions removed from a heat sensitive integrated circuit than resistor portions adjacent to the heat sensitive integrated circuit. Advantageous placement of feed resistor trim links to further manage heat dissipation are also disclosed. A line card which advantageously includes the line module is disclosed.

20 Claims, 12 Drawing Sheets

LINE INTERFACE MODULE

FIELD OF INVENTION

This invention relates generally to telephony line interface circuits and in particular to a module for a line interface circuit.

BACKGROUND OF THE INVENTION

It is well known that manufacturing costs directly affect a products profit margin. This is especially true where extremely high volumes are concerned. In the telecommunications industry for example, line interface cards as exemplified in U.S. Pat. No. 5,333,192, interface telephone sets to end offices and are manufactured by the millions. Even a cost savings of pennies in the manufacturing of a single line card can add up to a staggering overall savings where a manufacturer is manufacturing in excess of ten million of them annually.

On the manufacturing assembly line savings can be realized through a reduction in the total number of components that have to be mounted onto a line card printed circuit board. In an attempt to realize savings in this manner manufacturers have for many years looked to optimizing circuit design in the hopes of reducing component count.

Currently some manufacturers of line card interface circuits utilize two different component mounting technologies in every line card manufactured. Through hole mounting as well as more recent surface mount manufacturing techniques are often used at different stages of the manufacture. The added expense of surface mount capability is staggering as a result of equipment cost and the additional floor space required to house it. This problem is compounded in today's global market environment where customers essentially demand manufacturing facilities in their respective countries as a condition of sale. To respond, manufacturers interested in selling to global markets very often have to duplicate many times over, manufacturing facilities which include the two mounting technologies.

Earlier attempts by industry and even by the applicant to construct a complete line card circuit on ceramic substrate (e.g. Nortel® product DMS-1 Urban Line cards; 1983) have largely been unsuccessful. Much of the reason for the lack of success has been attributed to thermal problems as ceramic substrate is a better conductor of heat than more conventional fibreglass substrates resulting in heat generated from hot components interacting with other adjacent components in a compromising manner. By design, battery feed resistors dissipate significant heat which in turn affects temperature sensitive integrated circuits providing coding and decoding (Codec) functionality. Other heat generating integrated circuits such as Field Effect Transistors (FETs) or custom silicon often used in current limiting circuitry, further compound the heat problem. Two major thermal concerns which directly affect reliability include component solder joint fatigue and integrated circuits operating at compromising junction temperatures. Integrated circuits very often used in line card circuits include codec functionality and operating at increased temperatures severely affects transmission characteristics such as absolute channel noise, quantization distortion and absolute gain. The smaller the ceramic substrate used the more significant the thermal problem encountered. Increasing the ceramic substrate to a size where thermal problems are virtually non existent is not the solution as no savings are realized due to the high cost of the ceramic.

As large ceramic substrate structures are extremely expensive and in view of many known problems affecting reliability resulting from their inherent thermal properties, manufacturers today have limited there use to providing small printed feed resistor structures which occasionally include non heat sensitive passive components such as capacitors and other non printed resistors. Service providers for years have benefited from using ceramic structures in this manner as they provide known advantages such as providing very accurately trimable resistors and a desirable known failure mode in extreme conditions such as in the event of lightening strikes.

SUMMARY OF THE INVENTION

The invention seeks to provide a small cost effective line circuit module.

In accordance with a first aspect of the invention there is provided a line interface circuit module comprising: a substrate; two printed battery feed resistors disposed on the substrate; a heat sensitive integrated circuit disposed on the substrate and positioned such as to not overlap with the printed resistors to be relatively distant from heat dissipated from the resistors.

Positioning the heat sensitive circuit on the module substrate so as to not overlap with the feed resistors reduces the compromising effects of heat dissipated by the battery feed resistors on the operation of the heat sensitive integrated circuit.

Conveniently the integrated circuit is mounted on an opposing side of the substrate to the side having the printed battery feed resistors.

Advantageously the integrated circuit is positioned between the resistors. Having the integrated circuit mounted on an opposing side of the substrate to the battery feed resistors and between them further reduces the compromising effects of feed resistor heat dissipation on the integrated circuit.

Preferably at least one of the printed resistors of the line interface module has a layout pattern defining resistor portions wherein the resistance increases per unit distance in a direction towards the resistor and away from the heat sensitive integrated circuit.

Preferably at least one of the printed resistors of the line interface module has a layout pattern wherein a ratio of the resistance of part of the resistor to an area of the substrate supporting and for conducting heat from that part of the resistor is greater in areas of the substrate away from the integrated circuit than in areas adjacent to the integrated circuit.

Significant heat reduction in the area of the integrated circuit can be realized by effectively moving major heat dissipating portions of the resistor away from the integrated circuit.

In accordance with another aspect of the invention there is provided a line interface card comprising a main substrate a module mounted to the main substrate for electrical connection therewith, the module having a substrate with two printed battery feed resistors, a heat sensitive integrated circuit disposed on the substrate and positioned such as to not overlap with the printed resistors to be relatively distant from heat dissipated from the resistors.

Preferably the line interface card comprises at least one of the printed resistors having a layout pattern defining resistor portions wherein the resistance increases per unit distance in a direction towards the resistor and away from the heat sensitive integrated circuit.

Preferably the line interface card comprises at least one of the printed resistors having a layout pattern wherein a ratio of the resistance of part of the resistor to an area of the substrate supporting and for conducting heat from that part of the resistor is greater in areas of the substrate away from the integrated circuit than in areas adjacent to the integrated circuit.

The applicant has appreciated that a through hole mountable line card module having its own substrate and containing most of the line card circuitry including all of the surface mount components and printed feed resistors would then effectively become a single component. Providing innovative thermal design techniques have overcome known thermal problems and now allow such a module to be built on a small substrate. Global manufacturers may then have the module made in one location and would only have to then provide inexpensive through hole manufacturing capability in each country they sell to. The manufacturing of the line interface card is significantly simplified and requires only one mounting technology as only a few large mechanical components such as edge connectors, relays and transformers along with the one module would have to be through hole mounted. Manufacturing and testing of an assembled line card which includes such a module is simplified and significantly more cost affective.

With recent advances in technology (e.g. the Internet) and new customer requirements such as using telephone lines for many uses other that just voice, it is readily apparent to manufacturers that they will have many different line interface product requirements. Some if not all of these different line interface products will share common plain ordinary telephone (POTs) interface circuitry. Providing a small line card module allows easy reuse of common circuitry from one product to another without having to redesign and test line circuits which are well known to be extremely sensitive to layout configurations.

BRIEF DESCRIPTION OF THE DRAWINGS

The invention will be further understood with reference to the drawings in which.

DETAILED DESCRIPTION

Figure 1:
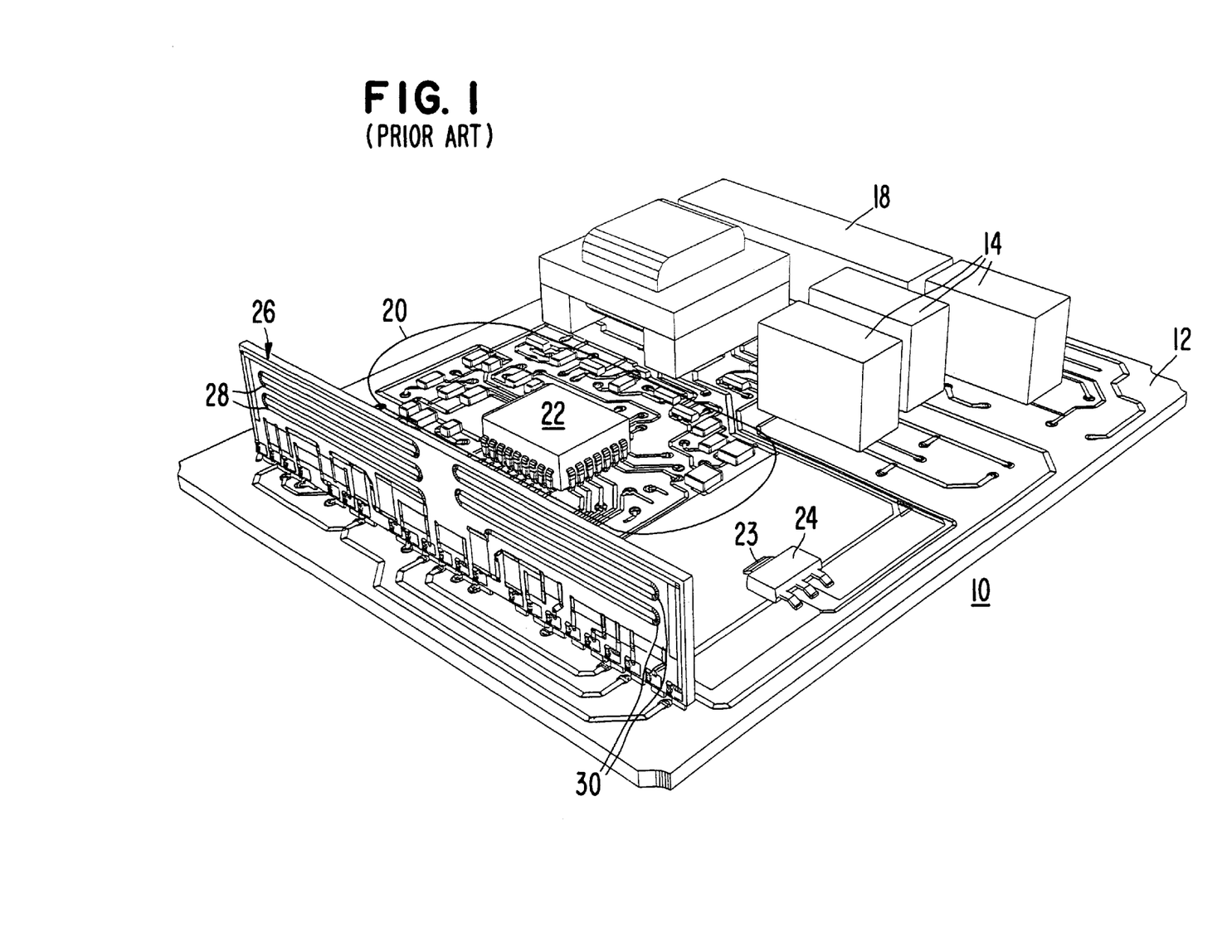
FIG. 1 illustrates an isometric view of a prior art Northern Telecom Ltd® line interface circuit card.

FIG. 1 illustrates an isometric view of a Northern Telecom® Ltd line interface card 10 currently used in many end offices around the world. Line interface cards provide a voice and signalling interface between a two wire analog subscriber line and an end office digital switch. The line interface card 10 of FIG. 1 is a physical embodiment of the line circuit of U.S. Pat. No. 5,333,192 issued on Jul. 26, 1994 and assigned to Northern Telecom® Ltd. The line interface card 10 comprises a main substrate 12 constructed of conventional Fibreglass (FR4) used for printed circuit boards. A first group of components comprising mechanical components, such as relays 14, a transformer 16 and an edge card connector 18, typical of many line cards, are shown through hole mounted at one end of the main substrate 12. A second group of encircled components 20 comprise surface mount components which include a custom integrated circuit (ASIC) 22 for providing among other functions, coding and decoding (Codec) functionality. A further integrated circuit known as a Field Effect Transistor (FET) 24 and which is used in implementing current limiting functionality in the line card circuitry of U.S. Pat. No. 5,333,192, is shown through hole mounted and physically removed from the ASIC 22. A heat conducting tab 23 of the FET 24 is soldered to a heat conducting plane (not shown) disposed on substrate 12 beneath tab 23 for providing heat sink capability. To handle the thermal requirements of the FET 24, the heat conducting plane occupies most of the area around the FET 24 not occupied by components or signal tracks. A through hole mounted ceramic single in line package (SIP) structure 26 comprises two printed battery feed resistors 28,30.

In general, it is known that it is desirable to limit component heat interaction. One of the ways this is achieved in the structure of FIG. 1 is by utilizing a FR4 substrate which provides for good conductive thermal isolation. A second technique used is to simply isolate physically known heat sources from heat sensitive components. In FIG. 1 the heat sensitive ASIC 22 is shown physically separated from the two major heat generating components, the FET 24 and the battery feed resistors 28,30 on SIP 26. This straight forward approach is relatively easy when one is working with large substrate areas and with substrates having low thermal conductive properties.

The applicant has appreciated that a through hole mountable line card module having its own substrate and containing most of the line card circuitry including all of the surface mount components would then effectively become a single component. Global manufacturers could then have the module made in one location and would only have to then provide inexpensive through hole manufacturing capability in each country they sell to. The manufacturing of the line interface card is significantly simplified as only a few large mechanical components such as edge connectors, relays and transformers along with one module would have to be through hole mounted. To minimize component count the applicant further appreciated the cost savings and advantages of utilizing a module having a ceramic substrate which could also incorporate the printed battery feed resistors

28,30. If achievable, a line interface circuit card could be manufactured having only through hole components mounted to an FR4 substrate 12. For example in FIG. 1, mechanical components 14,16, & 18 could remain substantially as shown and a single line card module would contain the FET 24, all surface mount components 20 and the two printed battery feed resistors 28,30. Utilizing a module having a ceramic substrate would maintain the previously mentioned advantages associated with providing very accurately trimable resistors and a desirable known failure mode in extreme conditions such as in the event of lightening strikes.

However, significant thermal problems were encountered in the development of such a ceramic line card module. Ceramic although a good electrical isolator, conducts heat in the order of 5 to 20 times better than an equivalent sized Fibreglass substrate, resulting in undesirable and compromising thermal interaction between components. Thermal associated problems increased significantly with attempts to further reduce the size of the ceramic substrate to an overall area not much larger than the area required for the printed battery feed resistors 28,30. Three primary sources of thermal concern were identified; battery feed resistors 28,30 for their known heat dissipation, the FET 24 for its heat dissipation contribution and the ASIC 22 for its sensitivity to high operating temperatures.

Figure 2:
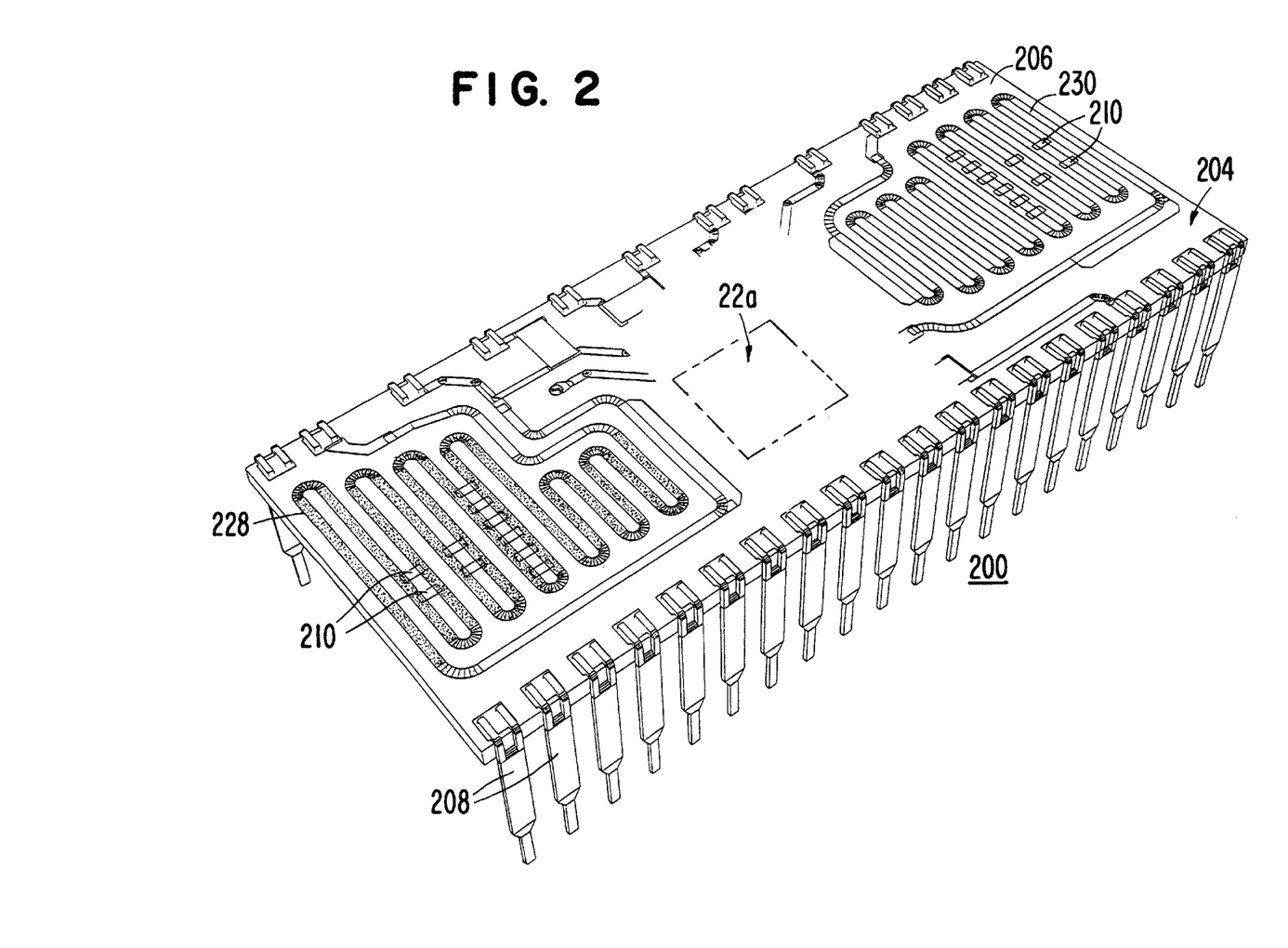
FIG. 2 illustrates an isometric top view of a first example embodiment of a line card module.

With reference to FIG. 2, an isometric top view of a first example embodiment of a line card module 200 is illustrated having length and width dimensions of 2.0 inches and 0.825 inches respectively. The line card module 200 illustrated, comprises a dual in line package having a high thermally conductive lead frame which utilizes copper alloy pins 208 and a ceramic substrate 204 which has a top 206 and bottom (not visible) component surface. The top surface 206 comprises printed components and in particular printed battery feed resistors 228,230, the main portions of which are shown as solid lines for illustrative purposes. Thick film resistors and associated tracking occupy most of top surface 206 central region between feed resistors 228,230 but have been hidden from view in FIG. 2, so as to show in chain dot the relative ASIC position 22a, which is surface mounted to the bottom surface of the ceramic substrate 204 in a position so as to not overlap with either of feed resistors 228,230. Preferably ASIC 22 is mounted on an opposing side of the substrate to the printed feed resistors 228,230. As can be seen printed battery feed resistors 228,230 have a layout pattern resembling a multiple period, sinusoidal wave. The sinusoidal portions have a common frequency but exhibit non-uniform peak to peak amplitudes. As seen in FIG. 2, the printed battery feed resistors 228,230 have a tapered envelope edge whereby the sinusoidal portions taper in amplitude as they get closer to a central region of the substrate 204. Portions of the printed battery feed resistors 228,230 closest to the central region of the substrate 204 in the area of the ASIC position 22a (shown in chain dot) have smaller peak to peak amplitudes to portions farther away from the ASIC position 22a. As the resistance is linear per unit length of printed track, this layout pattern effectively provides a printed resistor having greater resistance portions farther away from the ASIC position 22a than portions closer to the ASIC 22a position. For small substrates, significant temperature reductions can be obtained in the central region between the two feed resistors in the area of the ASIC position 22a as greater heat dissipating portions of respective battery feed resistors are correspondingly pushed farther away from the ASIC position 22a. Layout patterns for feed resistors 228,230 of FIG. 2 are but two examples of printed layout patterns wherein at least one of the printed resistors has a layout pattern defining resistor portions wherein the resistance increases per unit distance in a direction towards the resistor and away from the heat sensitive ASIC 22. Two or more adjacent spiral layouts of different overall resistance's connected in a series fashion and with the spiral having the larger overall resistance positioned farthest from the ASIC 22 is also contemplated as well as printed resistors having a linear or step tapered envelope. Printed resistors can be made having a varying track width to provide track portions relatively distant from the ASIC position 22a which have more resistance than track portions closer to the ASIC position 22a. Significant temperature reductions in the area of the ASIC 22 can be realized with providing a printed layout pattern wherein a ratio of the resistance of part of the resistor to an area of the substrate supporting and for conducting heat from that part of the resistor is greater in areas of the substrate away from the ASIC 22 than in areas adjacent to the ASIC 22.

As is known in the industry battery feed resistors require accurate values and this is achieved in known manner with laser trimming minute portions of respective printed resistors. In FIG. 2, conductive trim links 210 electrically connect and consequently short out adjacent portions of respective printed feed resistors and are used for initial coarse trimming of resistance values. Opening up trim links effectively increases the resistance of a respective feed resistor 228,230 by a predetermined amount. Trim links 210 in FIG. 2 are positioned in the mid region of the printed resistors 228,230 and in regions farthest removed from the ASIC 22. With this trim link arrangement the resistance and hence heat dissipation of printed portions farthest from the ASIC 22 never reached a maximum possible value as seldom are all trim links required to be severed or opened.

Figure 3:
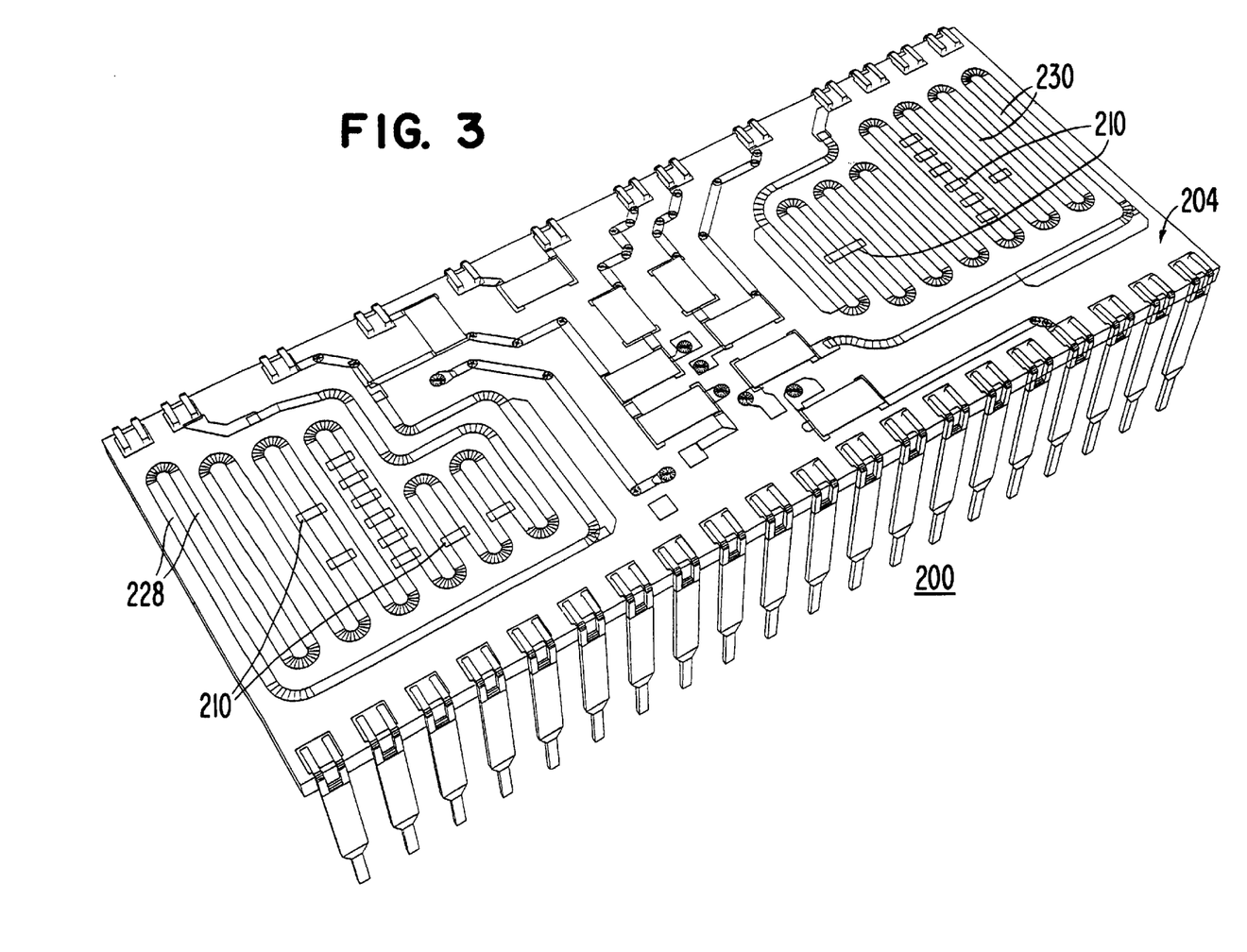
FIG. 3 illustrates an isometric top view of a second example embodiment of a line card module.

FIG. 3 illustrates a isometric top view of a second example embodiment of a line card module 200. Thick film resistors an associated tracking located between printed feed resistors are not hidden from view as was done for FIG. 2. Although not visible, ASIC 22 is located as in FIG. 2. Ultimately it was found that further heat reduction in the area of the heat sensitive ASIC 22 could be realized by strategic placement of the trim links 210. For a given resistor layout, increased heat dissipation was realized in portions of the feed resistors farther away from the ASIC position 22a by positioning trim links 210 in regions closer to the ASIC 22. During coarse trimming, trim links would be opened up only as required starting with those trim links 210 farthest away from the ASIC 22. For a given electrical condition, feed resistor 228 of FIG. 3 having the same printed layout as feed resistor 228 of FIG. 2 will dissipate more of its total heat energy in resistor portions farther away from the heat sensitive ASIC 22 as a result of the strategic trim link placement.

Figure 4:
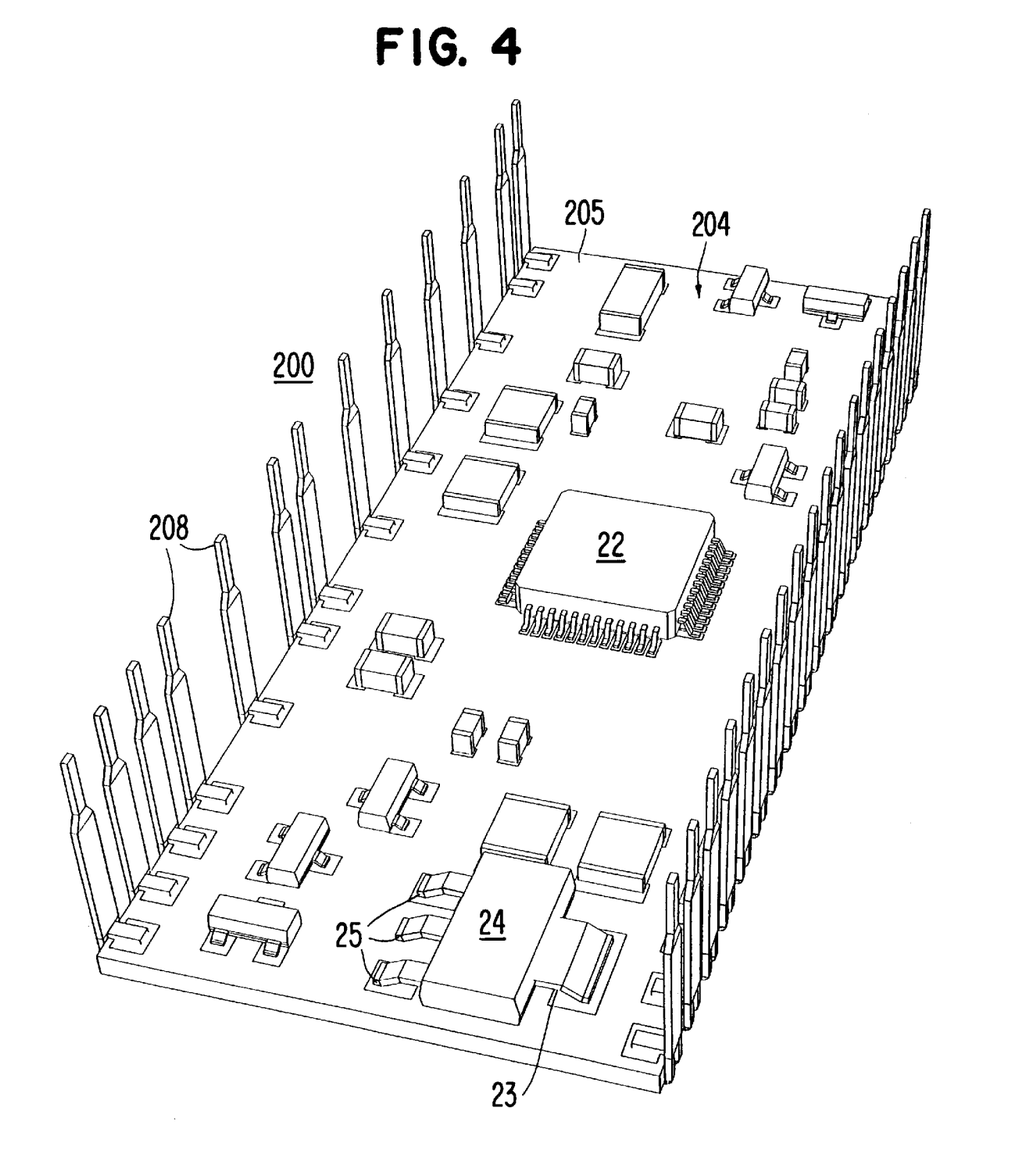
FIG. 4 illustrates an isometric bottom view of the line circuit module illustrated in FIG. 2.

FIG. 4 illustrates an isometric bottom view of the line circuit module 200 illustrated in the first example embodiment of FIG. 2. As previously stated the bottom surface 205 or underside of the module substrate 204 provides a surface for mounting surface mounted components. ASIC 22 can be seen in its central position as was indicated previously with reference to FIG. 2 by showing its relative position 22a in chain-dot as viewed from the top surface 206. Current limiting circuits of various designs are utilized on today's line cards to limit loop feed current for varying loop lengths. Current limiting circuits regardless of design generally will have at least one integrated circuit having an integral heat sink which will be a major contributor of heat energy. The current limiting circuit (not shown) embodied on the line card module 200 includes as a design choice the FET 24. It has been found for example that the FET 24 can dissipate 1.08 watts for a 50 milli amp loop current and a 200 ohm loop resistance. In the first example embodiment of which FIG. 2 provides the top view, the FET 24 is shown mounted on an end portion of the bottom surface 205 to maximize the physical spacing between it and the heat sensitive ASIC 22. As the substrate is only 0.825 inches wide by 2.0 inches in length, FIG. 4 clearly illustrates the FET 24 package having an overall length which approaches half the width the substrate 206. In FIG. 4, because of its relative size compared to the small substrate 206, FET 24 even though mounted in a corner of the substrate 206 has its connectivity pins 25 surface mounted roughly on the center line of the substrate 206. An integral heat sink in the form of a heat conducting tab 23 of the FET 24 is surface mounted to a corner region of the bottom surface 205 immediately adjacent lead frame pins 208. Measurements of heat dissipation in the FET 24 revealed that approximately half of the dissipation left the FET 24 package through leads 25 and the remaining half through the heat tab 23. This configuration effectively provided two direct heat coupling points from the FET 24 directly to the substrate 204 which resulted in undesirable temperature affects. Firstly the additional heat contribution by the FET 24 significantly increased the substrate temperature in the region of the ASIC 22. With one printed feed resistor 228 directly below the FET 24, the combined heat contribution raised the substrate temperature in the vicinity of the FET 24 sufficiently that the temperature delta between tab 23 and substrate proved insufficient to provide for effective cooling of the FET 24. Undesirable and compromising high FET 24 solder joint temperatures resulted. Temperature measurements also indicated the combined heat contribution raised the substrate temperature in the vicinity of the ASIC 22 to compromising high temperatures.

Figure 5:
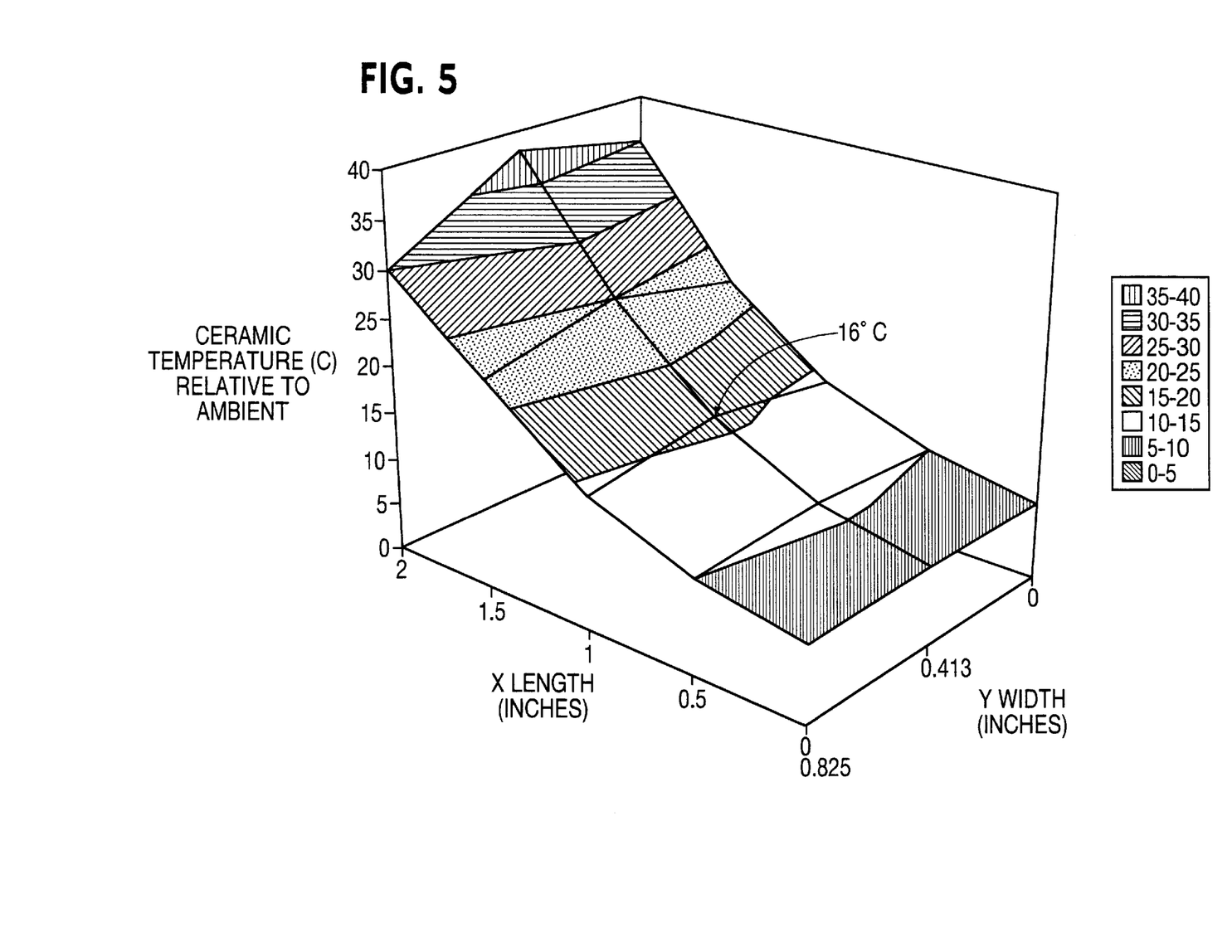
FIG. 5 illustrates in three dimensions the substrate surface temperature gradient for the module of FIG. 4 having one component powered.

FIG. 5 illustrates a three dimensional graph of the temperature gradient across the substrate for the FET 24 orientation of FIG. 4. The 'X' & 'Y' graph axis correspond to the substrate 204 length and width dimensions respectively in inches and the 'Z' axis represents temperature relative to 25 degrees ambient. With only the FET 24 dissipating power in FIG. 5, the heat contribution by the FET 24 raises the substrate temperature in the area of the ASIC 22 (at X=1, Y=0.413) to 16 degrees Celsius above a nominal 25 degrees ambient temperature. FIG. 5 also illustrates that the gradient pictured approximates that of a point heat source positioned midway along the end portion of Substrate 206.

Figure 6:
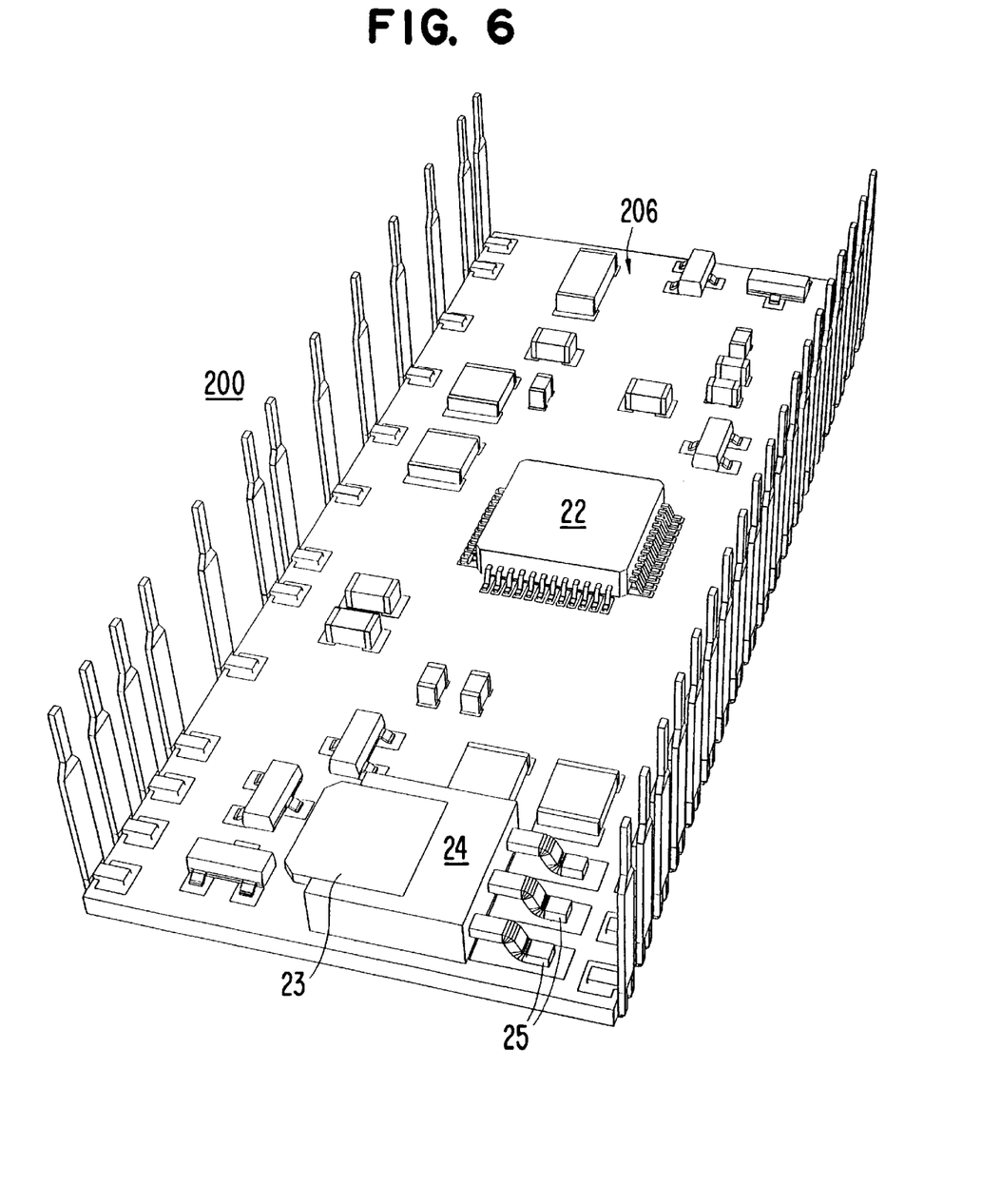
FIG. 6 illustrates an isometric bottom view of a line circuit module having a different component layout to that of FIG. 4.

FIG. 6 illustrates an isometric bottom view of the line circuit module 200 with the FET 24 orientated 180 degrees from the orientation of FIG. 4 and with tab 23 disposed in air. With this configuration several advantages were realized. With this configuration FET 24 provided only one direct heat coupling point from the FET 24 directly to the substrate 206 which in turn reduced the amount by which the FET 24 dissipation contributed to raising the substrate 204 temperature locally and in the area of the ASIC 22. With the ambient air being cooler than the substrate, having the integral heat sink (tab 23) disposed in the ambient air provided for a larger temperature differential and hence for more effective cooling. The junction temperature of the FET 24 was measured to be approximately the same for both configurations shown in FIG. 4 & 6. Having the tab 23 disposed in air versus soldered, effectively provides for a lowering of the substrate peak maximum temperature which in turn reduces compromising solder joint fatigue effects.

Figure 7:
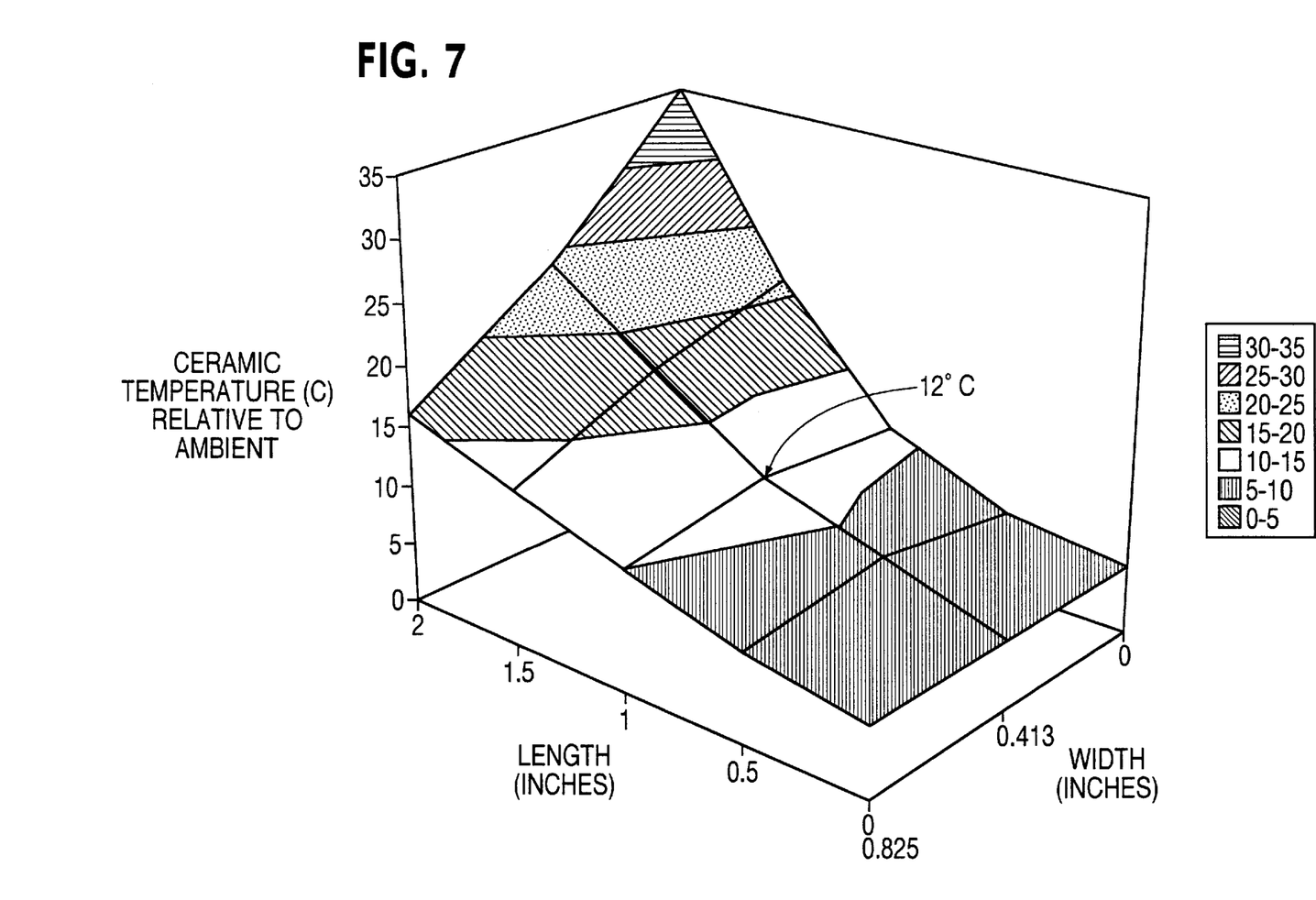
FIG. 7 illustrates in three dimensions the substrate surface temperature gradient for the module of FIG. 6 having one component powered.

FIG. 7 illustrates in three dimensions, a graph of the temperature gradient across the substrate for the FET 24 in the orientation of FIG. 6. With only the FET 24 dissipating power, as was the case for FIG. 5, the heat contribution by the FET 24 raised the substrate 204 temperature in the area of the ASIC 22 to only 12 degrees Celsius above a nominal 25 degrees ambient temperature. A significant four degree Celsius drop was obtained with the FET 24 orientation of FIG. 6. FIG. 7 also illustrates that the gradient pictured approximates that of a point heat source positioned in the corner of substrate 206.

Additional techniques advantageously enabled further shaping of the temperature gradient across the small ceramic substrate 206 to better control the temperature in the region of the temperature sensitive ASIC 22. With ceramic having better conducting properties than conventional Fibreglass substrates heat transferred to the substrate can be channelled away through lead frame pins 208. A module 200 utilizing highly thermally conductive pins such as copper alloy can be used to channel heat energy away from the substrate 206. Copper alloy pins for example have 4–10 times the heat conducting capability of more conventional phosphor bronze pins. The pins 208 can therefor effectively simultaneously provide for electrical interfacing as well providing a means for channelling heat away from the substrate 204. Providing wider than required tracking for electrical signals on the main substrate 12 in regions where pins 208 connect to the main substrate 12 advantageously provide for further heat sink capability at the interface between pins 208 and main substrate 12. Dedicated lead frame pins 208 used solely for channelling heat away from predetermined regions of the substrate can also prove advantageous in effective shaping of the temperature gradient across the small ceramic substrate 206. The dedicated pins 208 preferably connect and thus channel heat to a heat sink plane 11 (shown in FIG. 12) disposed on the main substrate 12. Predetermined regions of the substrate 206 to benefit most from the use of dedicated pins 208 would be areas of the substrate 206 closest to major heat contributing sources such as the area closest to the FET 24 or areas closest to the major heat dissipating portions of feed resistors 228,230. Optionally or in combination with, dedicated pins 208 may be positioned in areas of the substrate 206 closest to the temperature sensitive components such as the ASIC 22.

FIGS. 8–11 have been provided to illustrate and compare the relative contribution of some of the thermal management techniques described to advantageously shape the substrate 206 temperature gradient. FIGS. 8–11 illustrates in three dimensions, the temperature gradient across the small ceramic substrate 206 of an operating module 200 having operating conditions of a battery voltage of 52 volts, a 50 milli-amp loop current and a loop resistance of 200 ohms. As the module 200 is in operation the FET 24, the ASIC 22 and the battery feed resistors are all dissipating power in the amounts of 1.08 watts, 0.5 watts and 0.82 watts (0.41 watts each) respectively.

Figure 8:
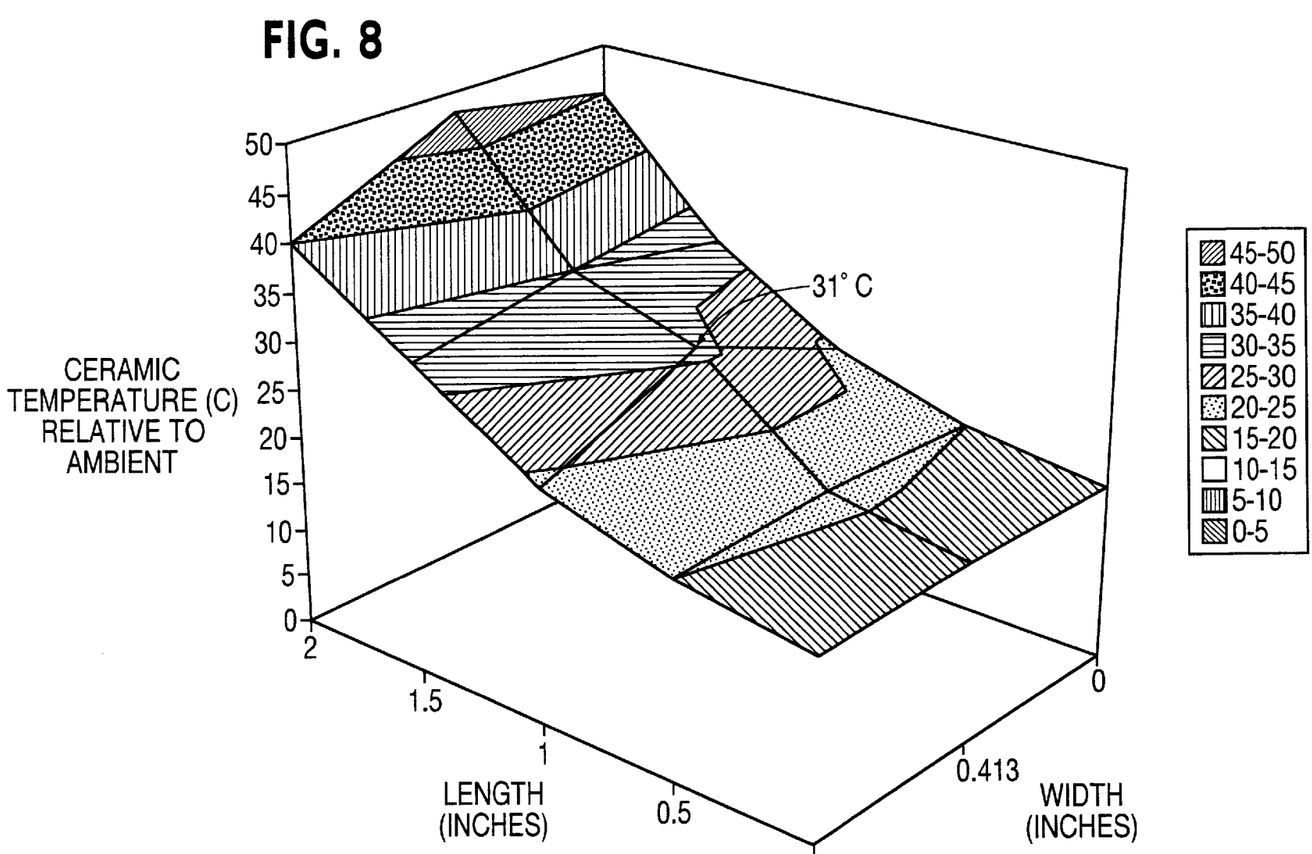
FIG. 8 illustrates in three dimensions the substrate surface temperature gradient for the module of FIG. 4 with all components powered.
Figure 9:
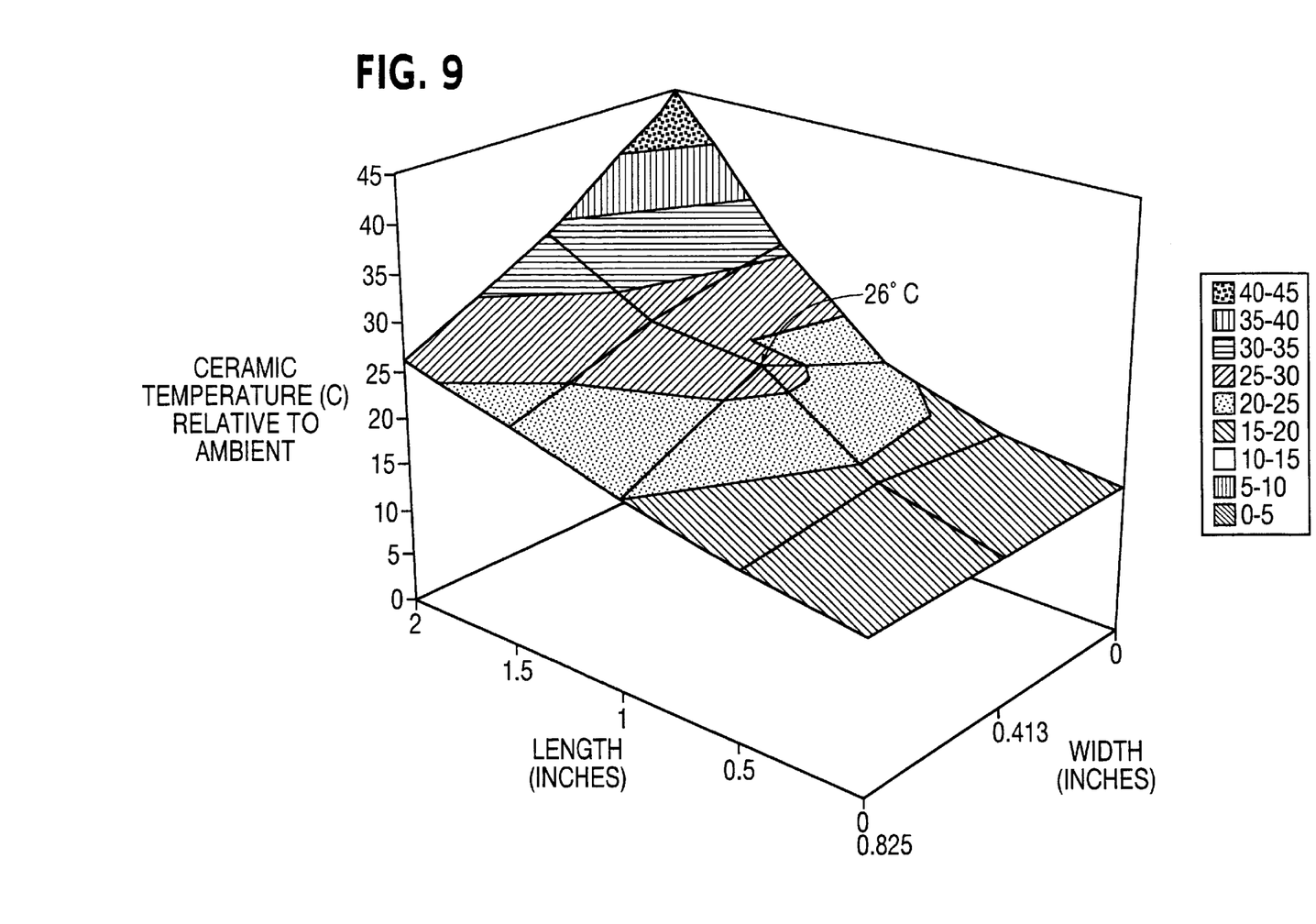
FIG. 9 illustrates in three dimensions the substrate surface temperature gradient for the module of FIG. 6 with all components powered.

FIG. 8 and FIG. 9 allow comparison of a module 200 in full operation for two different FET 24 orientations. In this comparison, neither module of FIG. 8 or FIG. 9 benefited from a highly conductive copper alloy lead frame for heat channelling, nor from heat conductive planes on the main substrate 12 and without strategic placement of trim links 210. FIG. 8 is representative of a module 200 having the FET configuration of FIG. 4, and FIG. 9 is representative of a module 200 having the FET configuration of FIG. 6. Note in particular in FIG. 8, the central region of the substrate 206 where the temperature sensitive ASIC 22 is located (i.e. at position length=1 inch, width=0.413 inches) sits at approximately 31 degrees Celsius and in FIG. 9 the central region sits at 27 degrees Celsius. Temperatures in the same areas of the substrate are in general lower for the configuration used to produce FIG. 9 than for FIG. 8.

Figure 10:
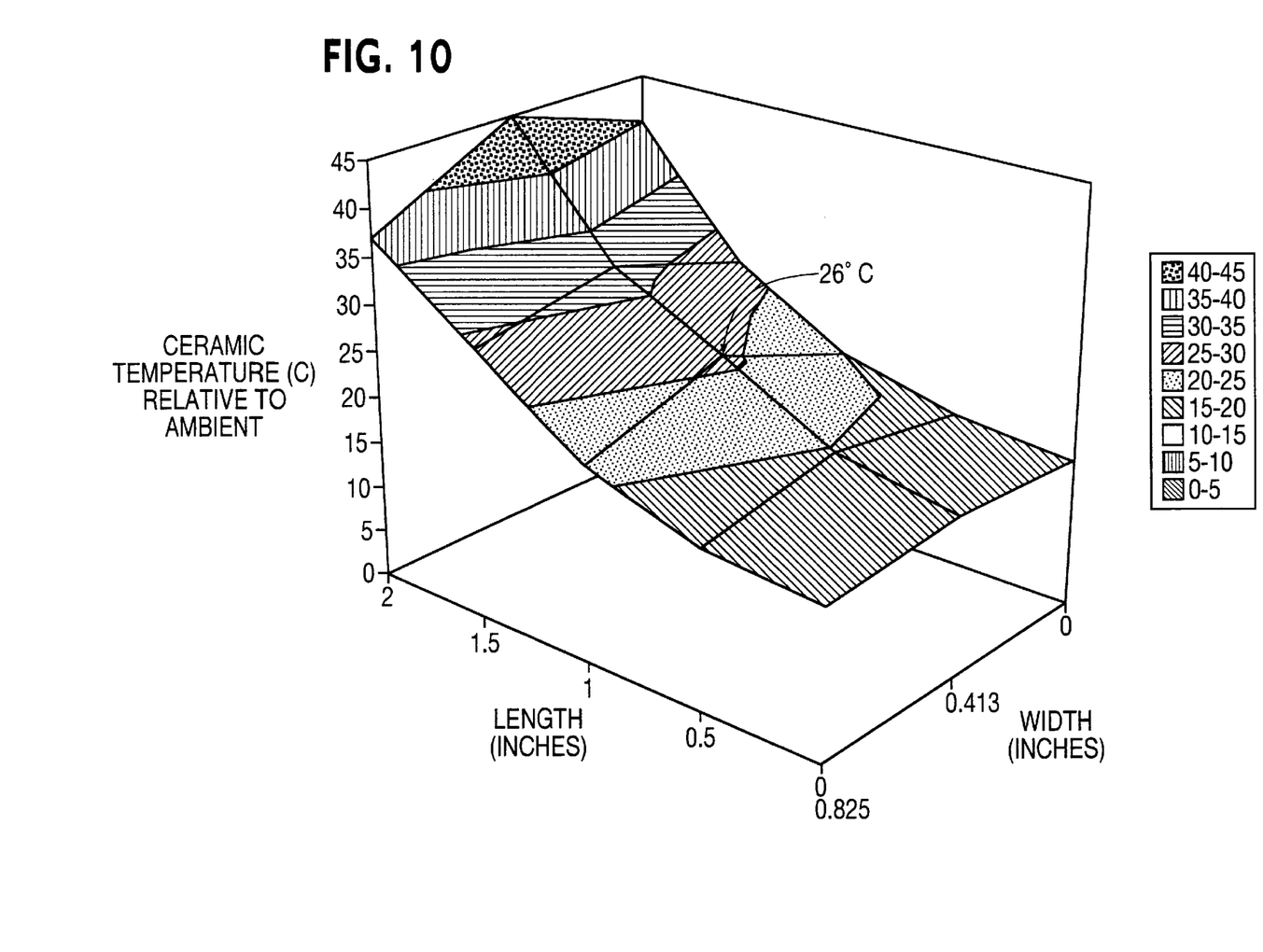
FIG. 10 illustrates in three dimensions the substrate surface temperature gradient for the module of FIG. 4 with all components powered and having further benefit of additional thermal management techniques.
Figure 11:
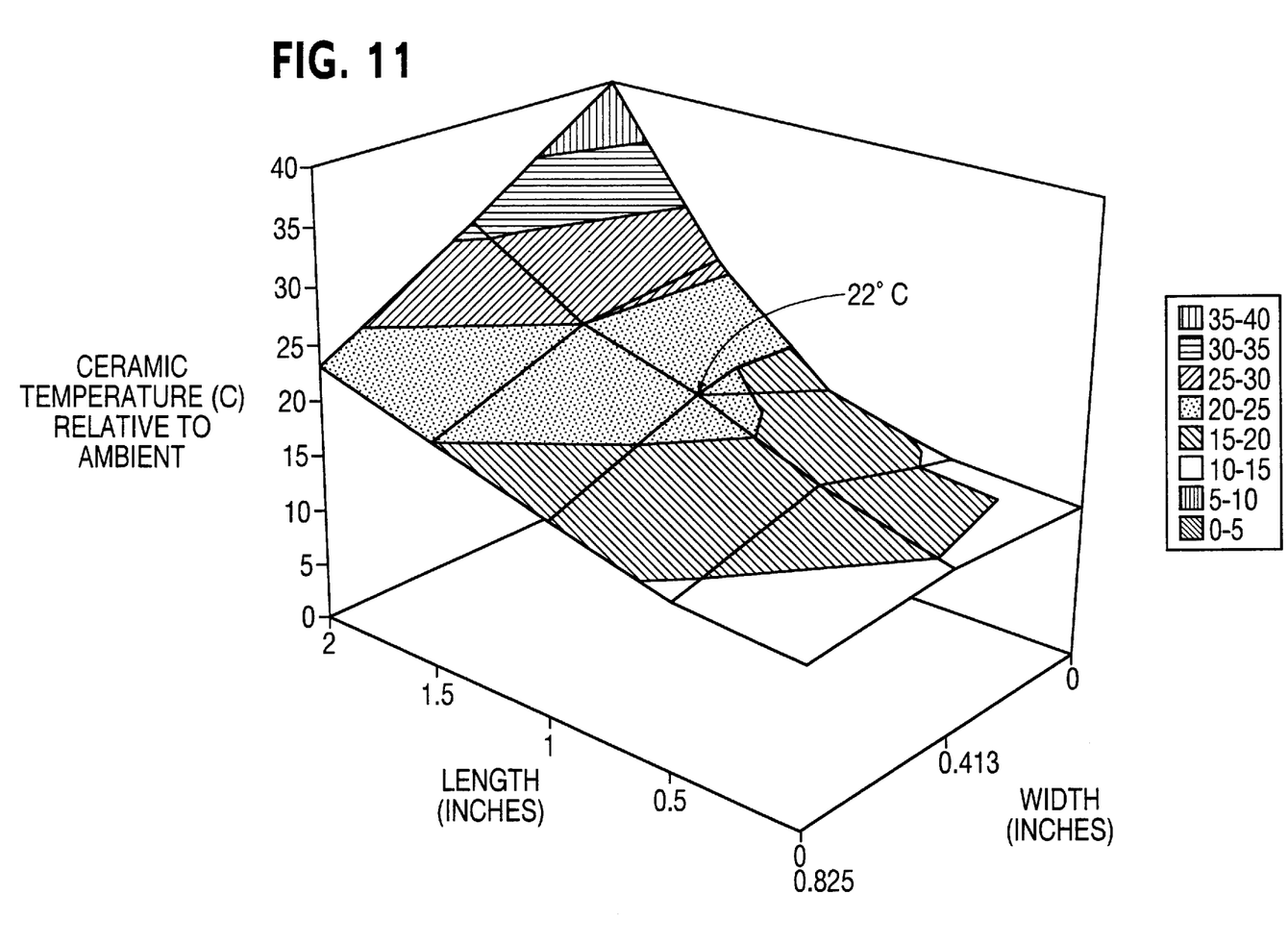
FIG. 11 illustrates in three dimensions the substrate surface temperature gradient for the module of FIG. 6 with all components powered and having further benefit of additional thermal management techniques.

FIG. 10 and FIG. 11 are similar with regard to FET 24 orientation to FIG. 8 and 9 respectively but illustrate respective gradients now having full benefit of a highly conductive copper alloy lead frame for heat channelling, a heat conductive plane on the main substrate 12 close to FET 24 and with strategic placement of trim links 210 as shown in FIG. 3. Again for comparison purposes note in particular in FIG. 10, the central region of the substrate 206 where the temperature sensitive ASIC 22 is located (i.e. at position length=1 inch, width=0.413 inches) sits at approximately 26 degrees Celsius and in FIG. 11 the central region sits at 22 degrees Celsius. Temperatures in the same areas of the substrate are in general lower for the configuration used to produce FIG. 11 than for FIG. 10.

Figure 12:
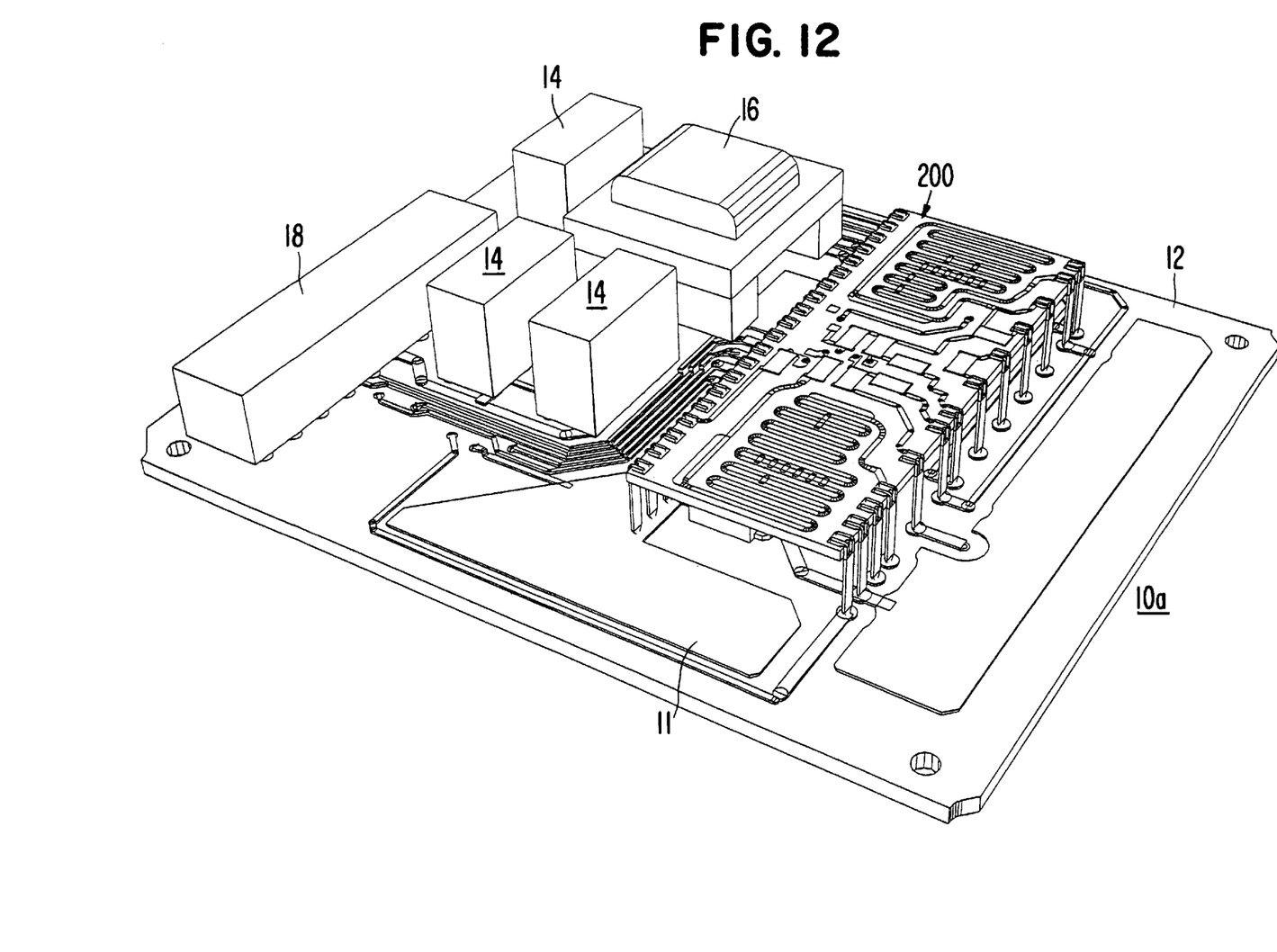
FIG. 12 illustrates a line interface card in accordance with an embodiment of the invention.

FIG. 12 illustrates a line interface card 10a in accordance with an embodiment of the invention. Mechanical components in both line card embodiments (FIG. 1 & FIG. 12), such as the relays 14, the transformer 16 and the edge card connector 18 are through hole mounted to the main substrate 12. The line interface card 10a of FIG. 12 further comprises the line circuit module 200 having its own substrate and containing most of the line card circuitry including all of the surface mount components (encircled components 20 of FIG. 1), two battery feed resistors and the FET. The line interface card 10a of FIG. 12 effectively has only six components of which all are through hole mounted. Heat concerns from using a small thermally conductive substrate have been managed through advantageous use of printed battery feed resistor layouts which provide for larger portions of heat to be dissipated in resistor portions removed from the heat sensitive integrated circuit than resistor portions adjacent to the heat sensitive integrated circuit. Solder joint fatigue issues are significantly reduced as the substrate peak temperature is lowered which in turn advantageously reduces the delta between peak maximum and minimum substrate temperatures.

Having managed component thermal interactions, global manufacturers now can then have the module made in one location and would only have to then provide inexpensive through hole manufacturing capability in each country they sell to. The manufacturing of the line interface card is significantly simplified as only a few large mechanical components such as edge connectors, relays and transformers along with the one module would have to be through hole mounted. A further savings is realized from a simplified testing requirement. The testing of an assembled line card now becomes simplified and hence provides a cost savings as their are fewer components and the module is previously fully tested by the supplier.

A further advantage of a line circuit module is that the module allows easy reuse of common line interface circuitry from one product to another without having to redesign and test line circuits which are well known to be extremely sensitive to layout configurations.

Numerous modifications, variations and adaptations may be made to the particular embodiments of the invention described herein without darting from the scope of the invention defined by the claims.

We claim:

1. A line interface circuit module comprising:
   a substrate;
   two printed battery feed resistors disposed on the substrate;
   a field effect transistor disposed on the substrate; and
   a heat sensitive integrated circuit disposed on the substrate and positioned such as to not overlap with the printed battery feed resistors and to be relatively distant from heat dissipated from the printed battery feed resistors.

2. A line interface circuit module as claimed in claim 1 wherein the integrated circuit is mounted on an opposing side of the substrate to the side having the printed battery feed resistors.

3. A line interface circuit module as claimed in claim 2 wherein the integrated circuit is positioned between the printed battery feed resistors.

4. A line interface circuit module comprising:
   a substrate;
   two printed battery feed resistors disposed on the substrate; and
   a heat sensitive integrated circuit disposed on the substrate and positioned such as to not overlap with the printed battery feed resistors and to be relatively distant from heat dissipated from the printed battery feed resistors;
   wherein at least one of the printed battery feed resistors has a layout pattern defining resistor portions wherein the resistance increases per unit distance in a direction towards the resistor and away from the heat sensitive integrated circuit.

5. A line interface circuit module comprising:
   a substrate;
   two printed battery feed resistors disposed on the substrate; and
   a heat sensitive integrated circuit disposed on the substrate and positioned such as to not overlap with the printed battery feed resistors and to be relatively distant from heat dissipated from the printed battery feed resistors;
   wherein at least one of the printed battery feed resistors has a layout pattern wherein a ratio of the resistance of part of the resistor to an area of the substrate supporting and for conducting heat from that part of the resistor is greater in areas of the substrate away from the integrated circuit than in areas adjacent to the integrated circuit.

6. A line interface circuit module as claimed in claim 4 wherein the printed resistor layout pattern has at least one tapered envelope edge.

7. A line interface circuit module as claimed in claim 6 wherein the taper is a linear taper.

8. A line interface circuit module as claimed in claim 7 wherein the taper is a stepped taper.

9. A line interface circuit module as claimed in claim 4 or claim 5 wherein the printed resistors further comprise trim links disposed between sections of each respective printed resistor.

10. A line interface circuit module as claimed in claim 9 wherein the trim links are disposed between sections of each printed resistor which are adjacent to the integrated circuit.

11. A line interface circuit module as claimed claim 4 wherein the substrate is ceramic.

12. A line interface circuit module as claimed in claim 11 further comprising a dual in line lead frame.

13. A line interface circuit module as claimed in claim 12 wherein the lead frame comprises copper alloy pins for increased thermal conductivity.

14. A line interface circuit module as claimed in claim 4 further comprising a heat generating integrated circuit having an integral heat sink and wherein the integrated circuit is mounted to the substrate with the integral heat sink disposed in air.

15. A line interface card comprising:

a main substrate;

a module mounted to the main substrate for electrical connection therewith, the module having a substrate with two printed battery feed resistors, a heat sensitive integrated circuit disposed on the substrate and positioned such as to not overlap with the printed resistors to be relatively distant from heat dissipated from the resistors.

16. A line interface card as claimed in claim 15 wherein the integrated circuit is positioned on an opposing side and between the two printed battery feed resistors.

17. A line interface card comprising:

a main substrate; and a module mounted to the main substrate for electrical connection therewith, the module having a substrate with two printed battery feed resistors, a heat sensitive integrated circuit disposed on the substrate and positioned such as to not overlap with the printed battery feed resistors and to be relatively distant from heat dissipated from the printed battery feed resistors;

wherein at least one of the printed battery feed resistors has a layout pattern defining resistor portions wherein the resistance increases per unit distance in a direction towards the resistor and away from the heat sensitive integrated circuit.

18. A line interface card comprising:

a main substrate; and a module mounted to the main substrate for electrical connection therewith, the module having a substrate with two printed battery feed resistors, a heat sensitive integrated circuit disposed on the substrate and positioned such as to not overlap with the printed battery feed resistors and to be relatively distant from heat dissipated from the printed battery feed resistors;

wherein at least one of the printed battery feed resistors has a layout pattern wherein a ratio of the resistance of part of the resistor to an area of the substrate supporting and for conducting heat from that part of the resistor is greater in areas of the substrate away from the integrated circuit than in areas adjacent to the integrated circuit.

19. A line interface card comprising:

a main substrate; and a module mounted to the main substrate for electrical connection therewith, the module having a substrate with two printed battery feed resistors, a heat sensitive integrated circuit disposed on the substrate and positioned such as to not overlap with the printed battery feed resistors and to be relatively distant from heat dissipated from the printed battery feed resistors;

wherein the module further comprises a dual inline lead frame having pins for providing the electrical connection and wherein a predetermined number of pins connect to a heat sink structure disposed on the line interface card to channel heat away from the substrate.

20. A line interface card as claimed in claim 19 wherein the heat sink structure comprises a printed heat conducting plane.

* * * * *